US012777772B2

(12) United States Patent
Yun et al.

(10) Patent No.: US 12,777,772 B2
(45) Date of Patent: Oct. 27, 2026

(54) FLEXIBLE DISPLAY APPARATUS

(71) Applicant: Samsung Display Co., Ltd., Yongin-si (KR)

(72) Inventors: Daesang Yun, Yongin-si (KR); Wanjung Kim, Yongin-si (KR); Hyoyoung Mun, Yongin-si (KR); Yongseung Park, Yongin-si (KR); Yiseul Um, Yongin-si (KR); Soyoung Lee, Yongin-si (KR); Younghoon Lee, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 566 days.

(21) Appl. No.: 18/300,716

(22) Filed: Apr. 14, 2023

(65) Prior Publication Data

US 2024/0040830 A1 Feb. 1, 2024

(30) Foreign Application Priority Data

Jul. 26, 2022 (KR) ........................ 10-2022-0092643

(51) Int. Cl.
*H10K 59/10* (2023.01)
*G02F 1/1333* (2006.01)

(52) U.S. Cl.
CPC ....... *H10K 59/10* (2023.02); *G02F 1/133302* (2021.01); *G02F 1/133305* (2013.01)

(58) Field of Classification Search
CPC ............ G06F 1/1652; G02F 1/133305; H10K 77/111; H10K 2102/311; G09F 9/301
See application file for complete search history.

(56) References Cited

U.S. PATENT DOCUMENTS 9,811,120 B2 * 11/2017 Namkung ......... G02F 1/133305
2016/0118616 A1 * 4/2016 Hiroki ...................... G09F 9/301 257/40
2017/0045914 A1 2/2017 Namkung et al.
2019/0101783 A1 * 4/2019 Bi ........................ G02F 1/13392
2020/0127216 A1 * 4/2020 Tao ...................... H10K 50/844
2021/0192989 A1 6/2021 Ahn et al.
2021/0193941 A1 * 6/2021 Li ........................ H10K 77/111
2021/0336219 A1 * 10/2021 Miao ...................... H10K 59/35
2022/0048813 A1 2/2022 Kim et al.
2022/0190264 A1 * 6/2022 Yun ....................... G06F 1/1652
2022/0223806 A1 7/2022 Ostholt et al.

FOREIGN PATENT DOCUMENTS

KR 10-2019-0036985 A 4/2019
KR 10-2020-0144626 A 12/2020
KR 10-2021-0081485 7/2021
KR 10-2021-0153676 12/2021
KR 10-2022-0021939 2/2022
KR 10-2022-0082964 6/2022

* cited by examiner

*Primary Examiner* — Chad M Dicke
*Assistant Examiner* — Jeremy Daniel Watts
(74) *Attorney, Agent, or Firm* — Innovation Counsel LLP

(57) ABSTRACT

A display apparatus includes a first substrate, and a display member disposed on the first substrate. The first substrate includes a first-first portion overlapping the display member, and a first-second portion overlapping the display member and spaced apart from the first-first portion.

18 Claims, 22 Drawing Sheets

FLEXIBLE DISPLAY APPARATUS

CROSS-REFERENCE TO RELATED APPLICATION(S)

This application claims priority to and benefits of Korean Patent Application No. 10-2022-0092643 under 35 U.S.C. § 119, filed on Jul. 26, 2022, in the Korean Intellectual Property Office, the entire contents of which are incorporated herein by reference.

BACKGROUND

1. Technical Field

One or more embodiments relate to a display apparatus and a method of manufacturing a display apparatus.

2. Description of the Related Art

A mobile electronic apparatus has been widely used. As mobile electronic apparatuses, tablet personal computers (PCs) are widely used recently as well as miniature electronic apparatuses such as mobile phones.

To support various functions, for example, to provide a user with visual information, such as images, the mobile electronic apparatuses include a display apparatus. Recently, as the parts driving a display apparatus have been miniaturized, the proportion of the display apparatus in an electronic apparatus has gradually increased and a structure that may be bent to form a certain angle with respect to a flat state is also under development.

SUMMARY

A display apparatus may have a structure in which various layers are stacked on a substrate including glass. As the substrate has a relatively high rigidity, the display apparatus may not be easy to bend.

One or more embodiments include a display apparatus capable of improving reliability in a bending operation of the display apparatus including a glass substrate, which is bendable in various shapes.

However, embodiments of the disclosure are not limited to those set forth herein. The above and other embodiments will become more apparent to one of ordinary skill in the art to which the disclosure pertains by referencing the detailed description of the disclosure given below.

According to one or more embodiments, a display apparatus may include a first substrate and a display member disposed on the first substrate, wherein the first substrate may include a first-first portion overlapping the display member, and a first-second portion overlapping the display member, the first-second portion being spaced apart from the first-first portion.

The first substrate may further include a first-third portion, wherein the first-third portion may be disposed between the first-first portion and the first-second portion and may have a thickness smaller than thicknesses of the first-first portion and the first-second portion.

The first-third portion may be integral with the first-first portion and the first-second portion.

A shape of at least one of the first-first portion and the first-second portion may be a linear shape.

A cross-sectional shape of at least one of the first-first portion and the first-second portion may be quadrangular.

At least one of a surface of the first-first portion adjacent to the first-second portion and a surface of the first-second portion adjacent to the first-first portion may have a curved surface.

The display member may include an inorganic insulating layer connected to the first substrate.

The display apparatus may further include an organic protective layer disposed between the first substrate and the display member and connected to the first substrate.

The display apparatus may further include an encapsulation layer disposed on the display member.

The display apparatus may further include a second substrate disposed over the display member.

The second substrate may include a second-first portion, a second-second portion spaced apart from the second-first portion, and a second-third portion disposed between the second-first portion and the second-second portion and having a thickness less than thicknesses of the second-first portion and the second-second portion.

The second-third portion may be integral with the second-first portion and the second-second portion.

A shape of at least one of the second-first portion and the second-second portion may be a linear shape.

A cross-sectional shape of at least one of the second-first portion and the second-second portion may be quadrangular.

At least one of a surface of the second-first portion adjacent to the second-second portion and a surface of the second-second portion adjacent to the second-first portion may have a curved surface.

The display apparatus may further include a sealing member sealing the first substrate and the second substrate.

The display apparatus may further include a resin layer disposed between the display member and the second substrate.

The first-first portion may include a plurality of first-first portions, the plurality of first-first portions may be spaced apart from each other in a line in a first direction, and the first-second portion may be spaced apart in a second direction from the first-first portion and disposed between the first-first portions adjacent to each other.

According to one or more embodiments, a method of manufacturing a display apparatus may include disposing a display member on a first substrate, and processing the first substrate, wherein the first substrate may include a first-first portion overlapping the display member, and a first-second portion overlapping the display member, the first-second portion being spaced apart from the first-first portion.

The processing of the first substrate may include irradiating a laser beam on the first substrate, and spraying etching solution on the first substrate.

These and/or other aspects will become apparent and more readily appreciated from the following detailed description of the embodiments, the accompanying drawings, and claims.

BRIEF DESCRIPTION OF THE DRAWINGS

The above and other aspects, features, and advantages of certain embodiments will be more apparent from the following description taken in conjunction with the accompanying drawings, in which.

Figure 3A:
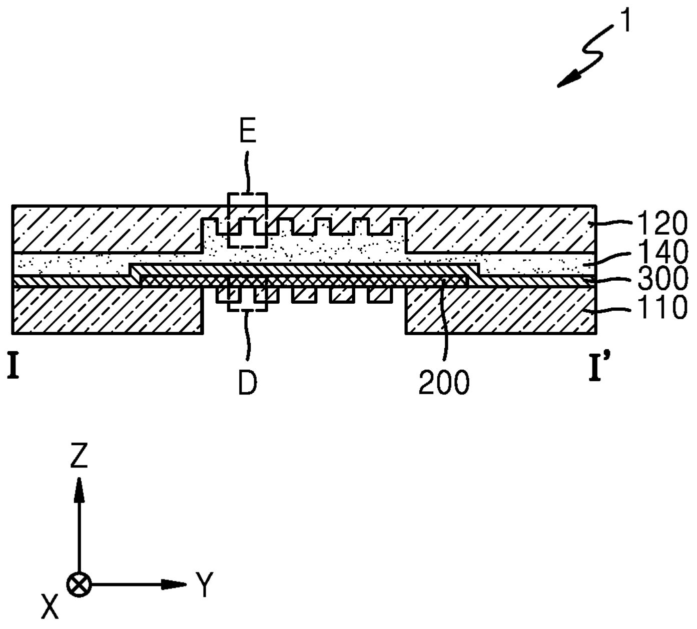
FIG. 3A is a schematic cross-sectional view of the display apparatus, taken along line I-I' of FIG. 1A according to an embodiment.
Figure 4A:
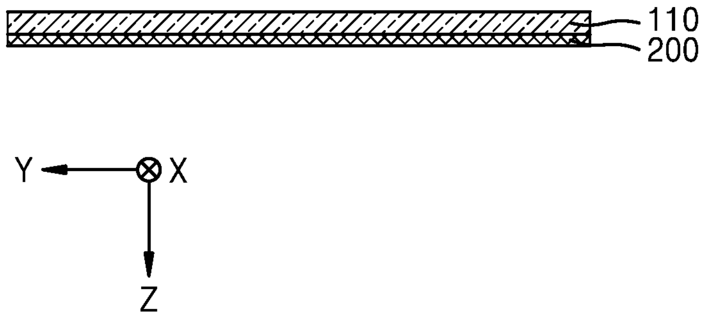
Figure 4B:
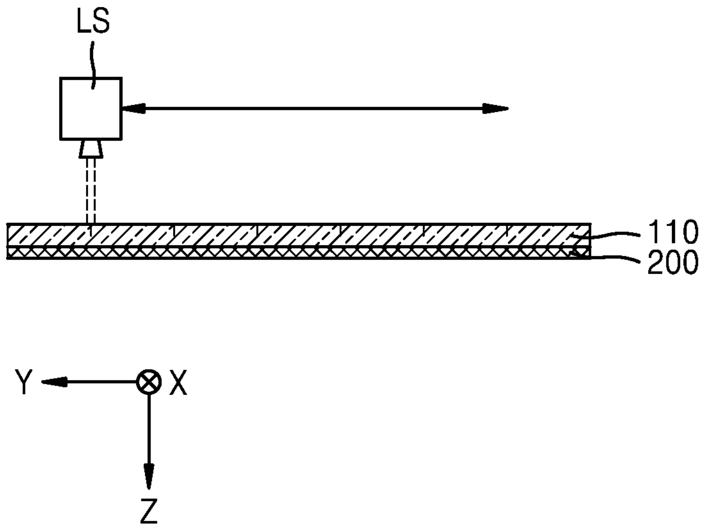
Figure 4C:
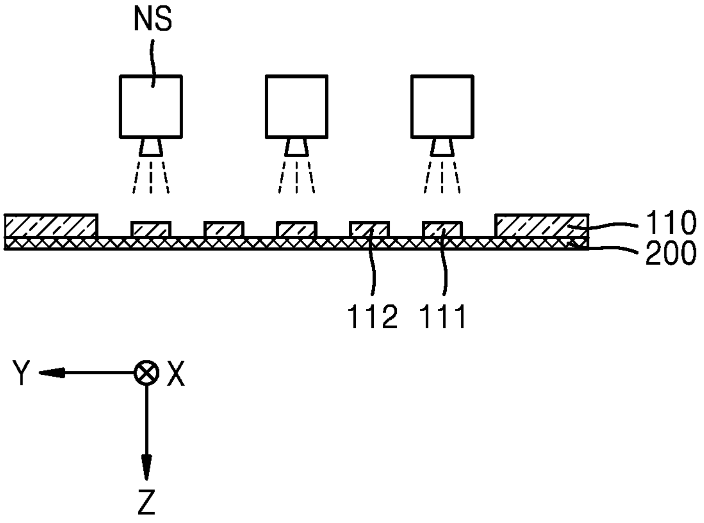
Figure 5A:
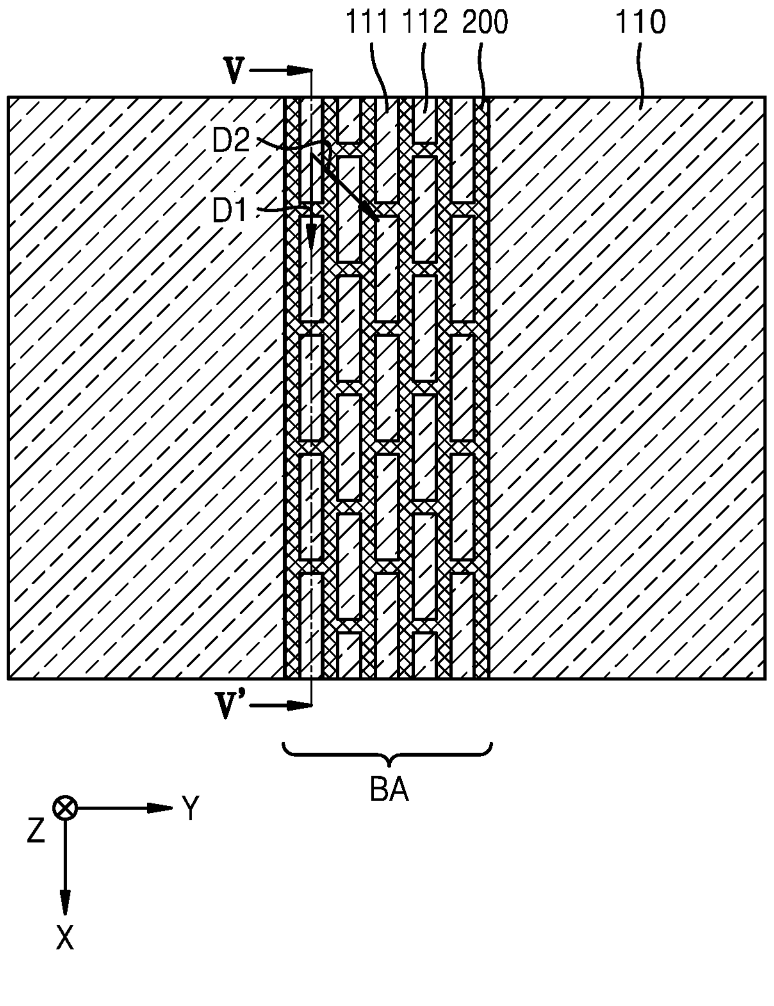
Figure 5B:
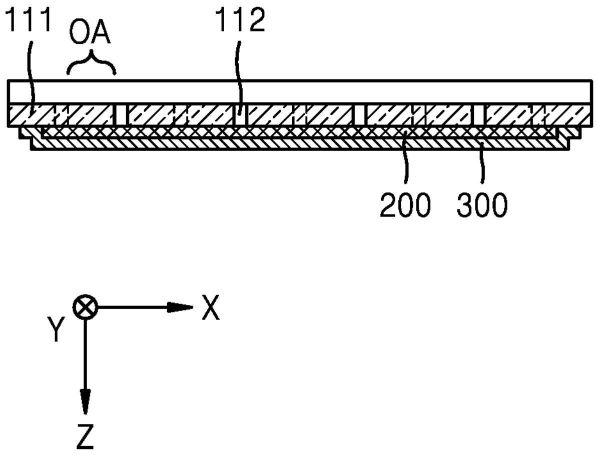
Figure 6A:
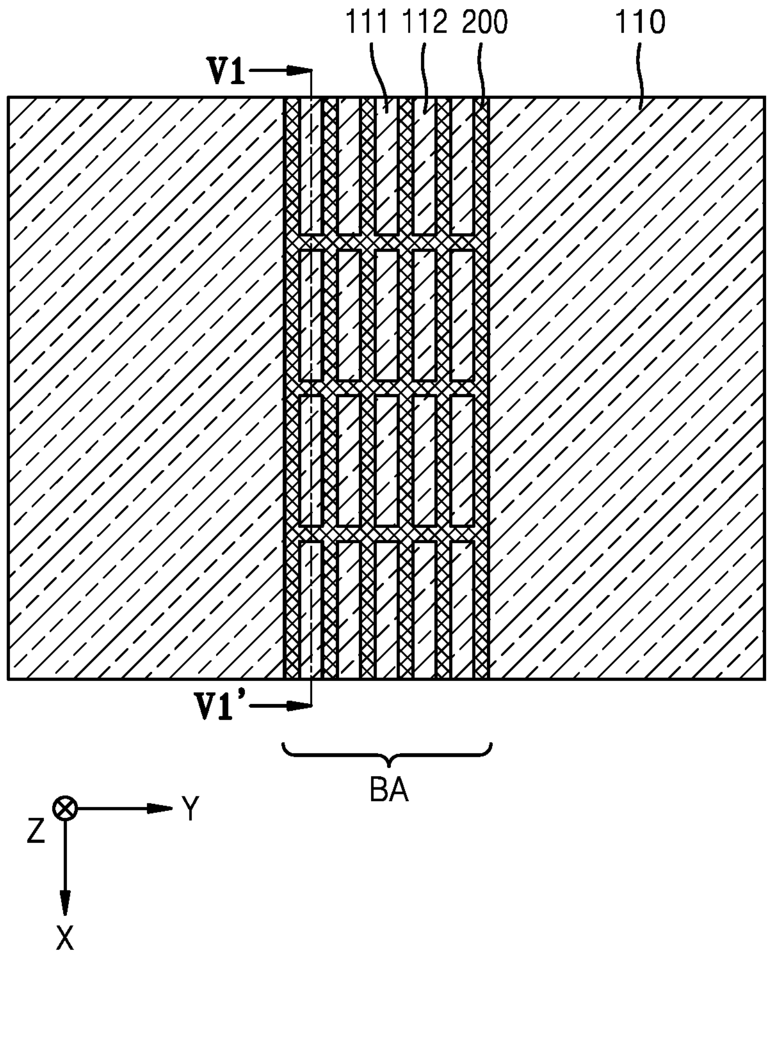
Figure 6B:
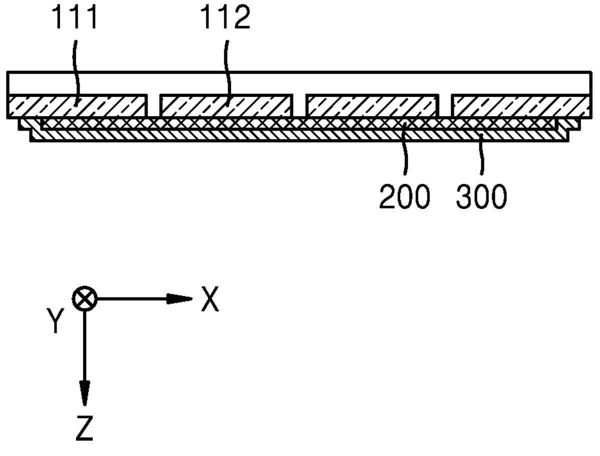

3C is a schematic enlarged view of a region E of FIG. 3A according to an embodiment;

FIGS. 4A to 4C are schematic plan views for explaining a method of manufacturing a display apparatus, according to an embodiment;

FIG. 5A is a schematic plan view of a portion of a display apparatus according to an embodiment;

FIG. 5B is a schematic cross-sectional view of the display apparatus, taken along line V-V' of FIG. 5A according to an embodiment;

FIG. 6A is a schematic plan view of a portion of a display apparatus according to an embodiment; and FIG. 6B is a schematic cross-sectional view of the display apparatus, taken along line VI-VI' of FIG. 5A according to an embodiment.

DETAILED DESCRIPTION OF THE EMBODIMENTS

In the following description, for the purposes of explanation, numerous specific details are set forth in order to provide a thorough understanding of various embodiments or implementations of the invention. As used herein "embodiments" and "implementations" are interchangeable words that are non-limiting examples of devices or methods disclosed herein. It is apparent, however, that various embodiments may be practiced without these specific details or with one or more equivalent arrangements. Here, various embodiments do not have to be exclusive nor limit the disclosure. For example, specific shapes, configurations, and characteristics of an embodiment may be used or implemented in another embodiment.

Unless otherwise specified, the illustrated embodiments are to be understood as providing features of the invention. Therefore, unless otherwise specified, the features, components, modules, layers, films, panels, regions, and/or aspects, etc. (hereinafter individually or collectively referred to as "elements"), of the various embodiments may be otherwise combined, separated, interchanged, and/or rearranged without departing from the invention.

The use of cross-hatching and/or shading in the accompanying drawings is generally provided to clarify boundaries between adjacent elements. As such, neither the presence nor the absence of cross-hatching or shading conveys or indicates any preference or requirement for particular materials, material properties, dimensions, proportions, commonalities between illustrated elements, and/or any other characteristic, attribute, property, etc., of the elements, unless specified. Further, in the accompanying drawings, the size and relative sizes of elements may be exaggerated for clarity and/or descriptive purposes. When an embodiment may be implemented differently, a specific process order may be performed differently from the described order. For example, two consecutively described processes may be performed substantially at the same time or performed in an order opposite to the described order. Also, like reference numerals denote like elements.

When an element, such as a layer, is referred to as being "on," "connected to," or "coupled to" another element or layer, it may be directly on, connected to, or coupled to the other element or layer or intervening elements or layers may be present. When, however, an element or layer is referred to as being "directly on," "directly connected to," or "directly coupled to" another element or layer, there are no intervening elements or layers present. To this end, the term "connected" may refer to physical, electrical, and/or fluid connection, with or without intervening elements. Further, the X-axis, the Y-axis, and the Z-axis are not limited to three axes of a rectangular coordinate system, such as the x, y, and z axes, and may be interpreted in a broader sense. For example, the X-axis, the Y-axis, and the Z-axis may be perpendicular to one another, or may represent different directions that are not perpendicular to one another. For the purposes of this disclosure, "at least one of A and B" may be construed as understood to mean A only, B only, or any combination of A and B. Also, "at least one of X, Y, and Z" and "at least one selected from the group consisting of X, Y, and Z" may be construed as X only, Y only, Z only, or any combination of two or more of X, Y, and Z. As used herein, the term "and/or" includes any and all combinations of one or more of the associated listed items.

Although the terms "first," "second," etc. may be used herein to describe various types of elements, these elements should not be limited by these terms. These terms are used to distinguish one element from another element. Thus, a first element discussed below could be termed a second element without departing from the teachings of the disclosure.

Spatially relative terms, such as "beneath," "below," "under," "lower," "above," "upper," "over," "higher," "side" (e.g., as in "sidewall"), and the like, may be used herein for descriptive purposes, and, thereby, to describe one elements relationship to another element(s) as illustrated in the drawings. Spatially relative terms are intended to encompass different orientations of an apparatus in use, operation, and/or manufacture in addition to the orientation depicted in the drawings. For example, if the apparatus in the drawings is turned over, elements described as "below" or "beneath" other elements or features would then be oriented "above" the other elements or features. Thus, the term "below" can encompass both an orientation of above and below. Furthermore, the apparatus may be otherwise oriented (e.g., rotated 90 degrees or at other orientations), and, as such, the spatially relative descriptors used herein interpreted accordingly.

The terminology used herein is for the purpose of describing particular embodiments and is not intended to be limiting. As used herein, the singular forms, "a," "an," and "the" are intended to include the plural forms as well, unless the context clearly indicates otherwise. Moreover, the terms "comprises," "comprising," "includes," and/or "including," when used in this specification, specify the presence of stated features, integers, steps, operations, elements, components, and/or groups thereof, but do not preclude the presence or addition of one or more other features, integers, steps, operations, elements, components, and/or groups thereof. It is also noted that, as used herein, the terms "substantially," "about," and other similar terms, are used as terms of approximation and not as terms of degree, and, as such, are utilized to account for inherent deviations in measured, calculated, and/or provided values that would be recognized by one of ordinary skill in the art.

Various embodiments are described herein with reference to sectional and/or exploded illustrations that are schematic illustrations of embodiments and/or intermediate structures. As such, variations from the shapes of the illustrations as a result, for example, of manufacturing techniques and/or tolerances, are to be expected. Thus, embodiments disclosed herein should not necessarily be construed as limited to the particular illustrated shapes of regions, but are to include deviations in shapes that result from, for instance, manufacturing. In this manner, regions illustrated in the drawings may be schematic in nature and the shapes of these regions may not reflect actual shapes of regions of a device and, as such, are not necessarily intended to be limiting.

Figure 1A:
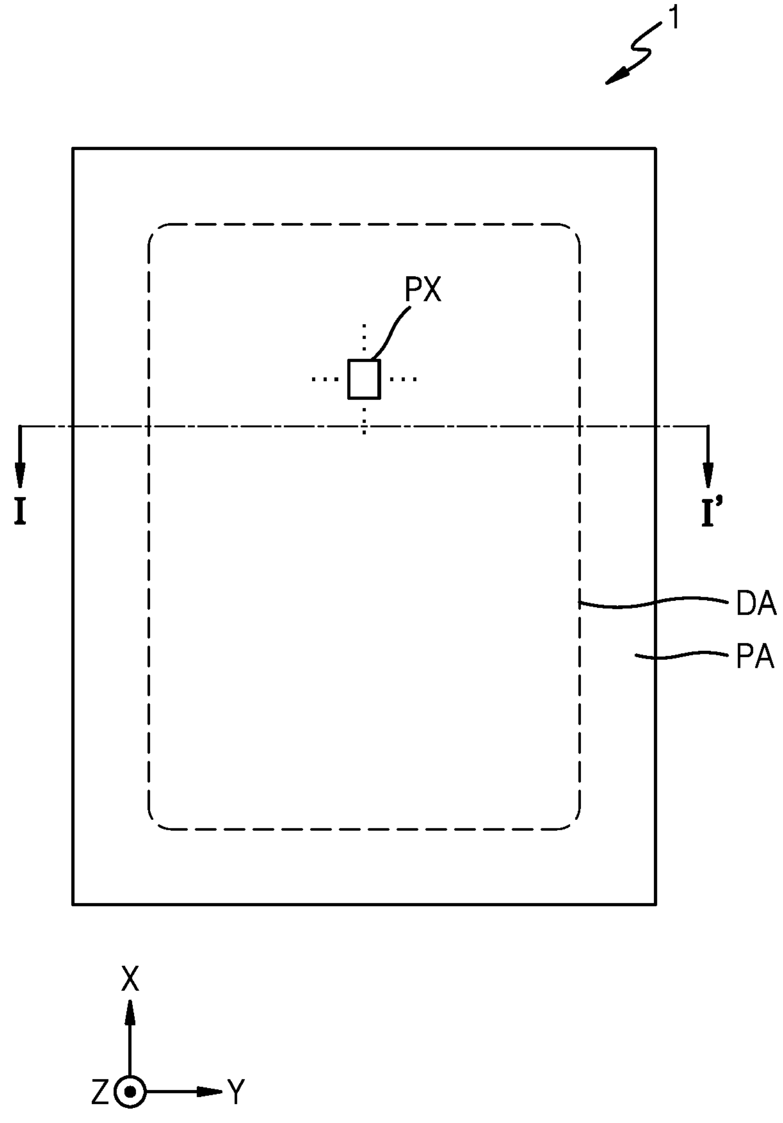
FIG. 1A is a schematic plan view of a display apparatus according to an embodiment.
Figure 1B:
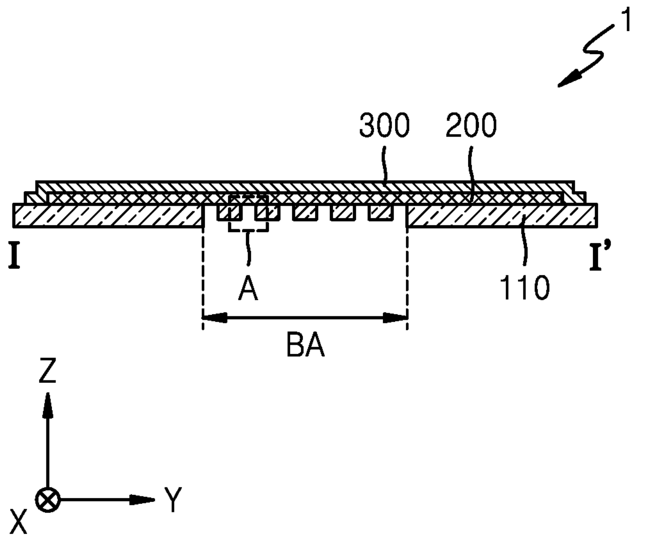
FIG. 1B is a schematic cross-sectional view of the display apparatus, taken along line I-I' of FIG. 1A according to an embodiment.
Figure 1C:
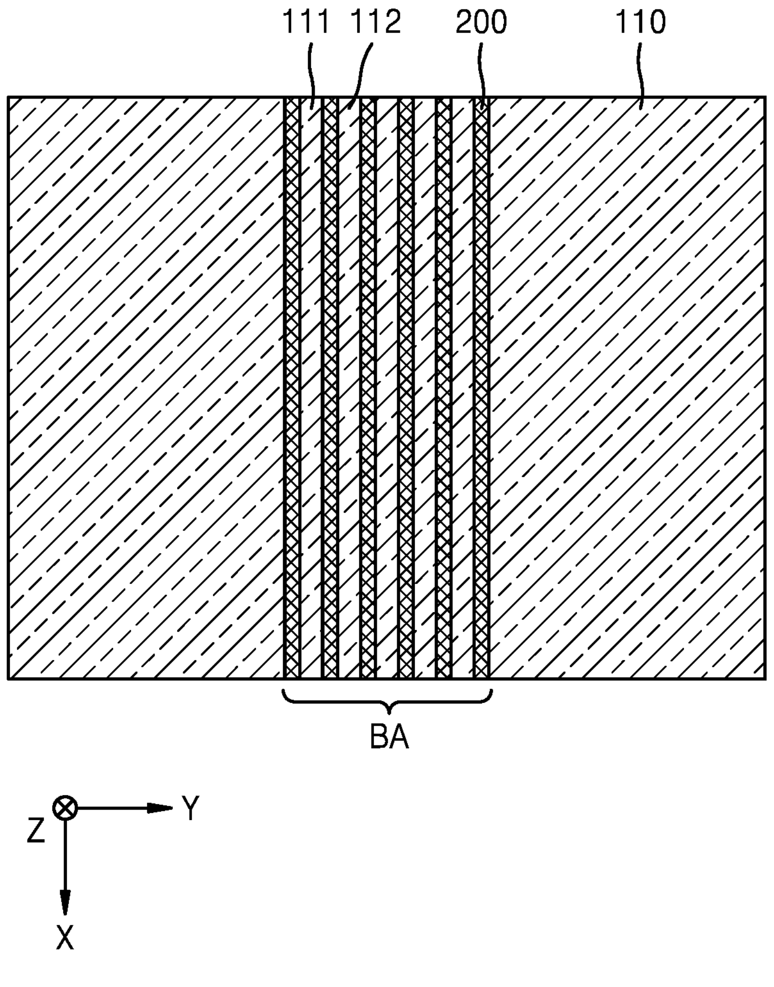
FIG. 1C is a schematic plan view of a portion of a display apparatus according to an embodiment.
Figure 1D:
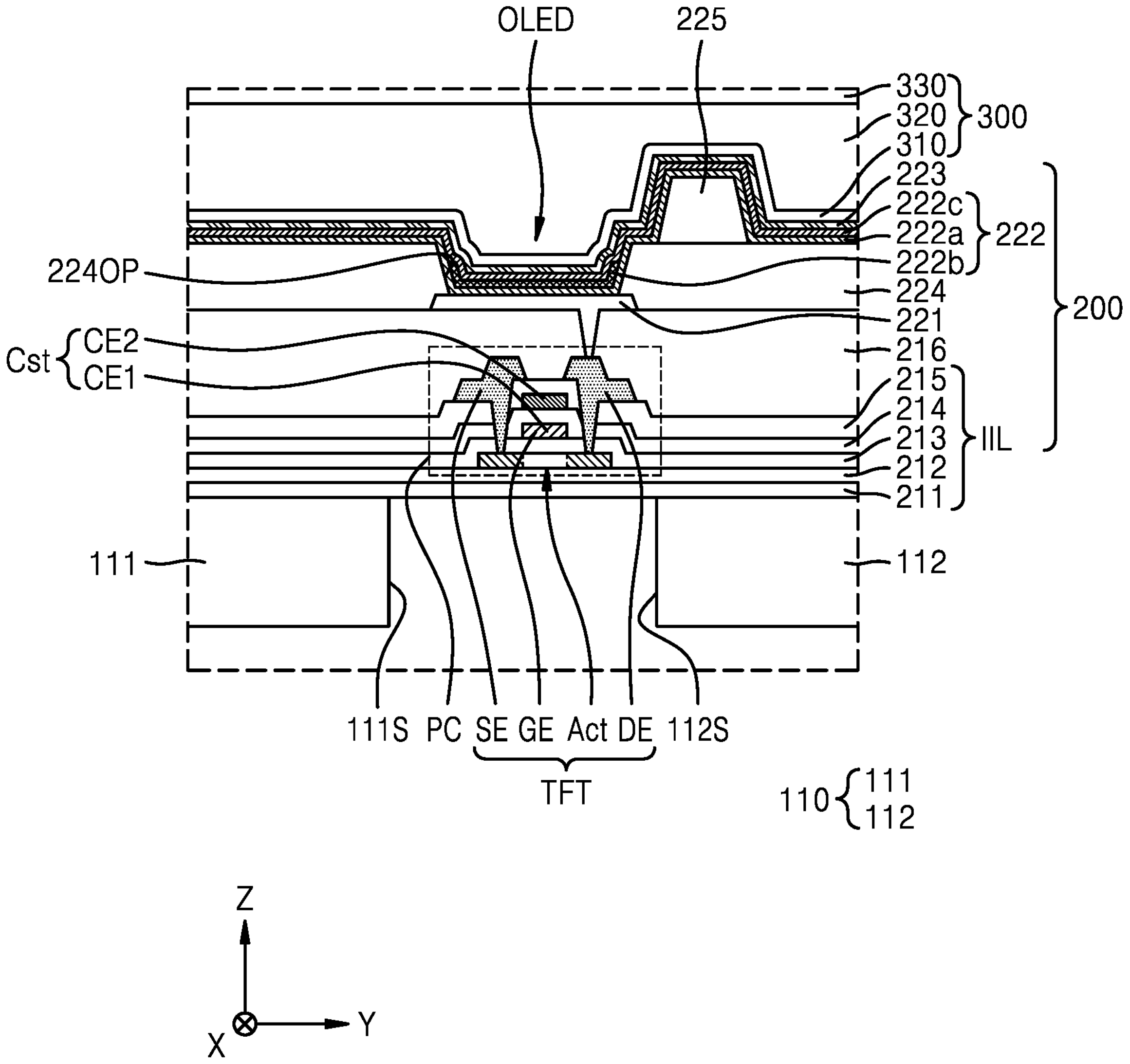
FIG. 1D is a schematic enlarged view of a region A of FIG. 1B according to an embodiment.
Figure 1E:
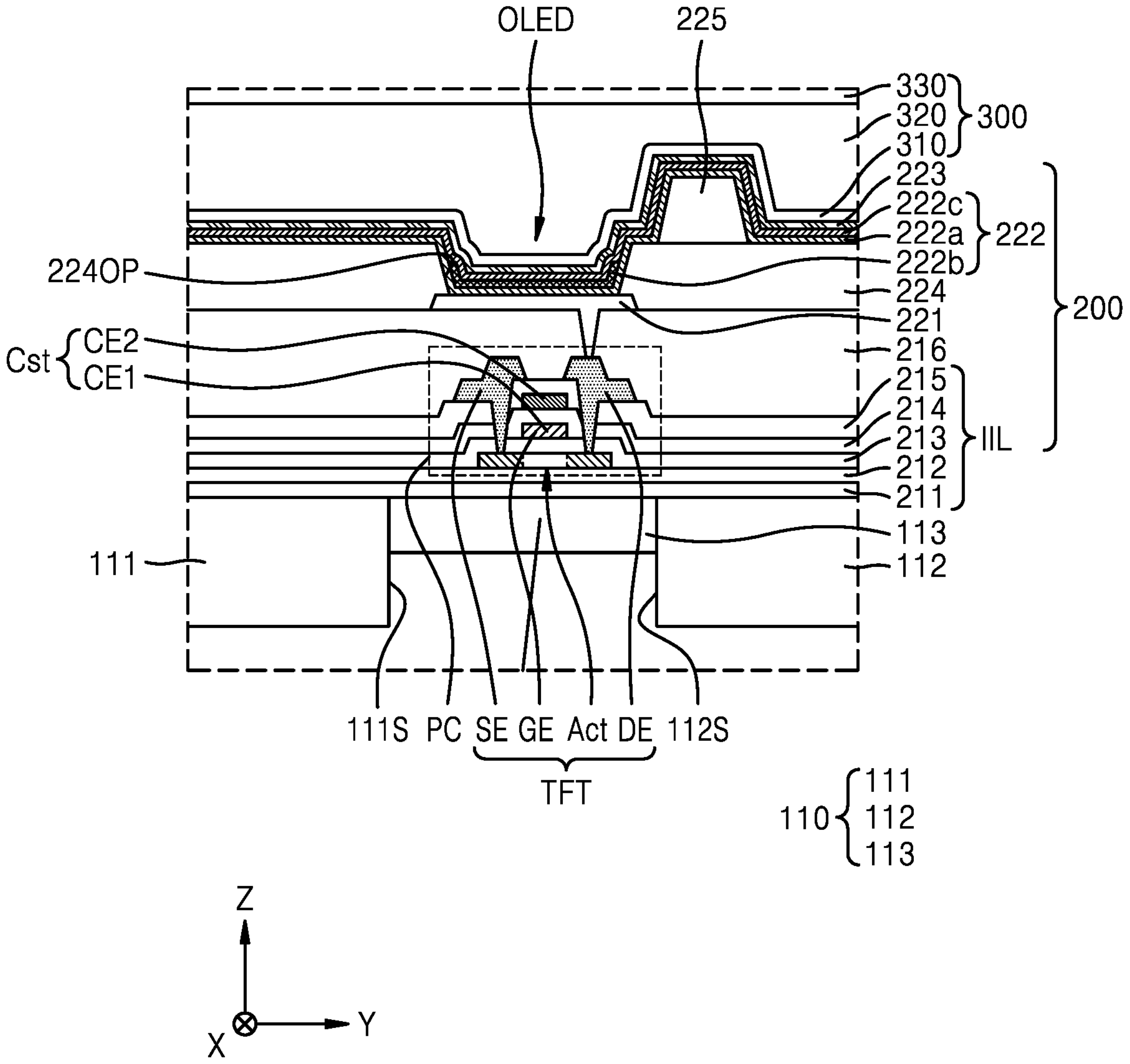
FIG. 1E is a schematic enlarged view of the region A of FIG. 1B according to an embodiment.
Figure 1F:
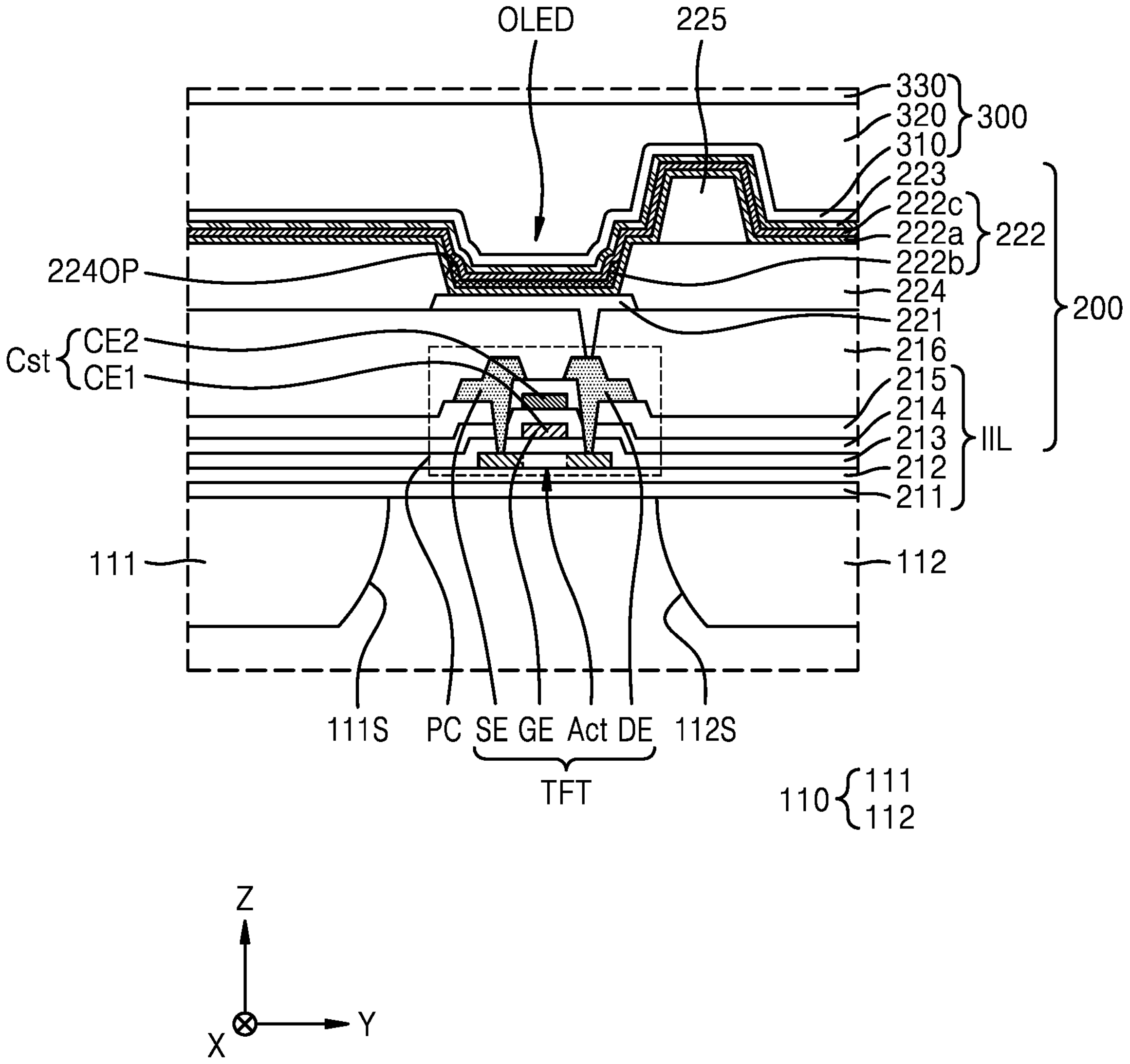
FIG. 1F is a schematic enlarged view of the region A of FIG. 1B according to an embodiment.
Figure 1G:
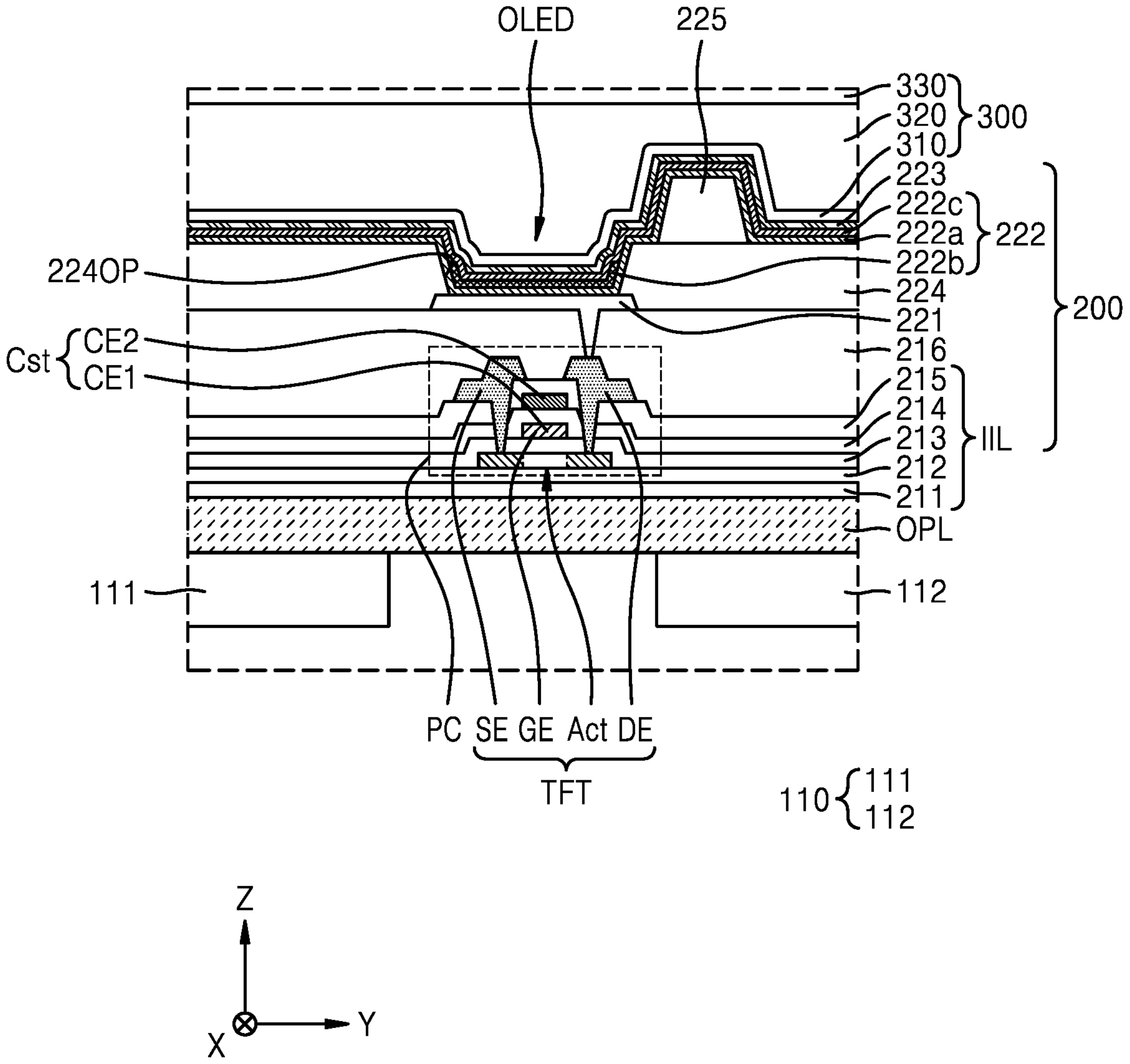
FIG. 1G is a schematic enlarged view of the region A of FIG. 1B according to an embodiment.
Figure 1H:
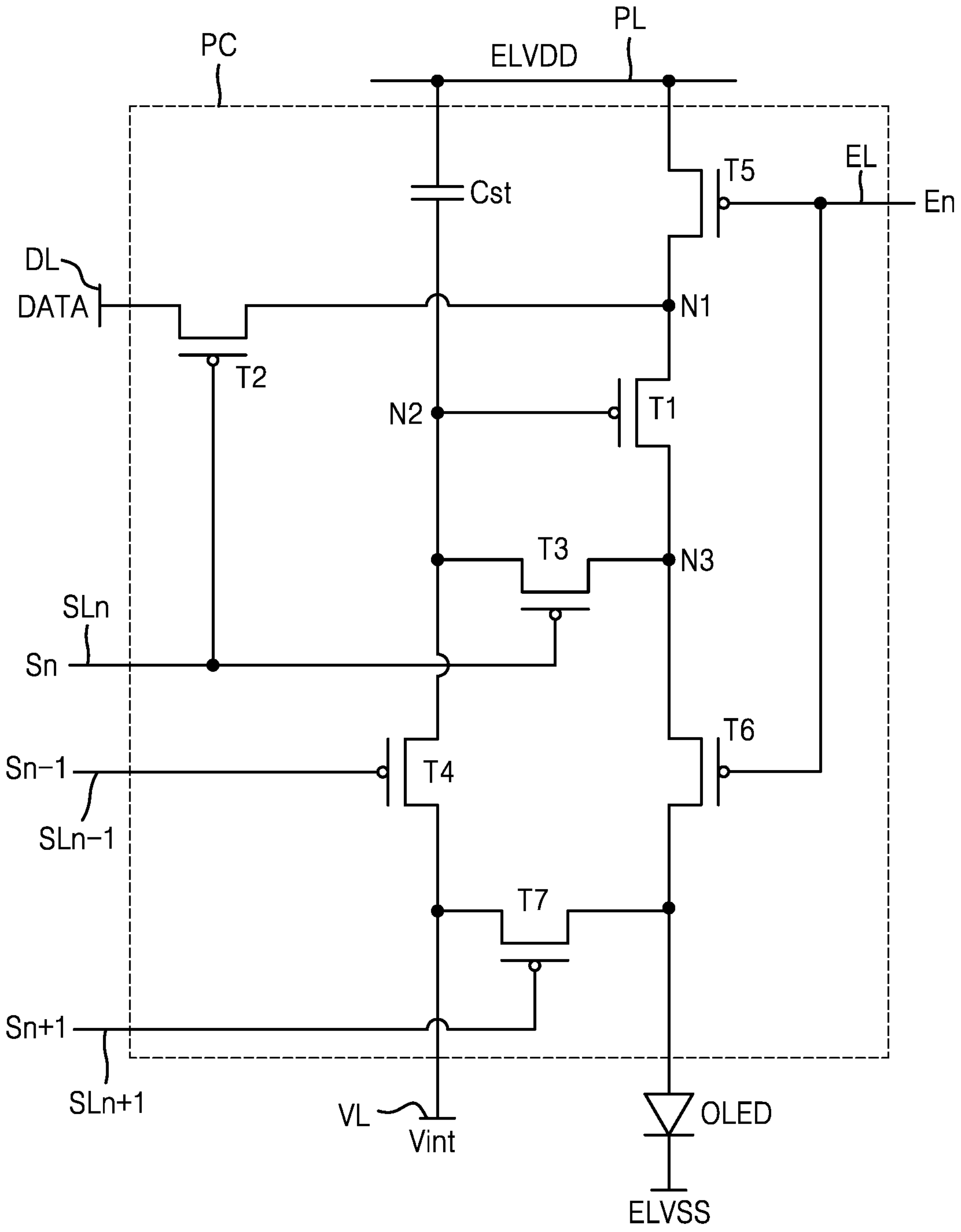
FIG. 1H is a schematic diagram of an equivalent circuit of a pixel according to an embodiment.

FIG. 1A is a schematic plan view of a display apparatus according to an embodiment, FIG. 1B is a schematic cross-sectional view of the display apparatus, taken along line I-I' of FIG. 1A according to an embodiment, FIG. 1C is a schematic plan view of a portion of a display apparatus according to an embodiment, FIG. 1D is a schematic enlarged view of a region A of FIG. 1B according to an embodiment, FIG. 1E is a schematic enlarged view of the region A of FIG. 1B according to an embodiment, FIG. 1F is a schematic enlarged view of the region A of FIG. 1B according to an embodiment, FIG. 1G is a schematic enlarged view of the region A of FIG. 1B according to an embodiment, and FIG. 1H is an equivalent circuit diagram of a pixel according to an embodiment.

Referring to FIG. 1A, the display apparatus 1 manufactured according to an embodiment may include a display area DA and a peripheral area PA outside the display area DA. The display apparatus 1 may display images through an array of pixels PX arranged two-dimensionally in the display area DA.

The peripheral area PA may be a region that does not display images and may surround the display area DA entirely or partially. A driver and the like may provide electric signals or power to pixel circuits respectively corresponding to the pixels PX. The driver and the like may be arranged in the peripheral area PA. A pad may be arranged in the peripheral area PA. The pad may be a region to which electronic elements or a printed circuit board may be electrically connected.

Hereinafter, though the display apparatus 1 includes an organic light-emitting diode OLED as a light-emitting element, the display apparatus 1 according to an embodiment is not limited thereto. In another example, the display apparatus 1 may be a light-emitting display apparatus including an inorganic light-emitting diode, e.g., an inorganic light-emitting display apparatus. The inorganic light-emitting diode may include a PN diode including inorganic material semiconductor-based materials. In case that a forward-bias voltage is applied to a PN-junction diode, holes and electrons may be injected and energy created by recombination of the holes and the electrons may be converted to light energy. Thus, light of a certain color may be emitted. The inorganic light-emitting diode may have a width in the range of several micrometers to hundreds of micrometers. In an embodiment, the inorganic light-emitting diode may be denoted by a micro light-emitting diode. In another example, the display apparatus 1 may be a quantum-dot light-emitting display apparatus.

The display apparatus 1 may be used as a display screen in various products including televisions, notebook computers, monitors, advertisement boards, Internet of things (IoTs) apparatuses as well as portable electronic apparatuses including mobile phones, smart phones, tablet personal computers (PCs), mobile communication terminals, electronic organizers, electronic books, portable multimedia players (PMPs), navigations, and ultra mobile personal computers (UMPCs). For example, the display apparatus 1 according to an embodiment may be used in wearable devices including smartwatches, watchphones, glasses-type displays, and head-mounted displays (HMDs). In an embodiment, the display apparatus 1 may be used as a display screen in instrument panels for automobiles, center fascias for automobiles, or center information displays (CIDs) arranged on a dashboard, room mirror displays that replace side mirrors of automobiles, and displays arranged on the backside of front seats as an entertainment for back seats of automobiles.

Referring to FIG. 1B, the display apparatus 1 may include a first substrate 110, a display member 200, and an encapsulation layer 300.

The display member 200 may be disposed on the first substrate 110. The encapsulation layer 300 may be disposed on the display member 200. The encapsulation layer 300 may cover the display member 200 and may prevent external moisture and oxygen from penetrating the display member 200.

The display apparatus 1 may include a bent area BA in which bending is performed. The bent area BA may overlap the display member 200. As an example, referring to FIG. 1B, the display apparatus 1 may be bent around an X axis in the bent area BA. However, this is only one example, and a method in which the display apparatus 1 is bent is not limited thereto. As an example, the display apparatus 1 may include bent areas BA, and an axis around which the display apparatus 1 in each bent area BA is bent may be various.

Referring to FIGS. 1C and 1D, the first substrate 110 may be a support substrate having high rigidity. As an example, the first substrate 110 may include a transparent glass material including $SiO_2$ as a main component. However, this is an example, and the first substrate 110 may include at least one of a metal, a plastic, and an acrylic material. As the area of the display member 200 increases, bending or waviness may be formed in the display member 200. As an example, in the case where the display apparatus 1 is included in televisions (TVs) and notebook computers, bending or waviness may increase. In an embodiment, as the display member 200 is disposed on the first substrate 110 that is flat, a phenomenon that the bending or waviness increases may be reduced.

The first substrate 110 may include a first-first portion 111 and a first-second portion 112. The first-first portion 111 and the first-second portion 112 may be provided in the bent area BA of the display apparatus 1. For example, the first-first portion 111 and the first-second portion 112 may be disposed to overlap the display member 200. The first-first portion 111 may be apart from the first-second portion 112. For example, flexibility of the display apparatus 1 may increase in the bent area BA of the display apparatus 1.

As an example, a shape of at least one of the first-first portion 111 and the first-second portion 112 may be a linear shape having an X axis direction. However, this is only an example, and the shapes of the first-first portion 111 and the first-second portion 112 are not limited thereto.

The first-first portion 111 may include a first-first surface 1115 adjacent to the first-second portion 112. For example, the first-second portion 112 may include a first-second surface 112S adjacent to the first-first portion 111. For example, the first-first surface 1115 and the first-second surface 112S may be surfaces facing each other. As an example, the first-first surface 1115 and the first-second surface 112S may include a plane. For example, as shown in FIG. 1D, a shape of at least one of the first-first portion 111 and the first-second portion 112 may be quadrangular in terms of a cross-sectional shape. However, this is an example, and the shapes of the first-first portion 111 and the first-second portion 112 are not limited thereto.

The display member 200 may include an inorganic insulating layer IIL, a pixel circuit PC, an organic insulating layer 216, an organic light-emitting diode OLED, a pixel-defining layer 224, and a spacer 225. The inorganic insulating layer IIL may include a barrier layer 211, a buffer layer 212, a first gate insulating layer 213, a second gate insulating layer 214, and an interlayer insulating layer 215. The inorganic insulating layer IIL may be connected to the first substrate 110.

The barrier layer 211 may be disposed on the first substrate 110. The barrier layer 211 may be a layer that prevents or reduces penetration of external foreign materials. The barrier layer 211 may be a single layer or a multi-layer including an inorganic material such as silicon nitride ($SiN_x$), silicon oxide ($SiO_2$), and/or silicon oxynitride (SiON).

The buffer layer 212 may be disposed on the barrier layer 211. The buffer layer 212 may include an inorganic insulating material such as silicon nitride ($SiN_x$), silicon oxynitride (SiON), and silicon oxide ($SiO_2$), and may include a single layer or a multi-layer including the inorganic insulating materials.

The pixel circuit PC may be disposed on the buffer layer 212. The pixel circuit PC may include a thin-film transistor TFT and a storage capacitor Cst. In an embodiment, the thin-film transistor TFT may include a semiconductor layer Act, a gate electrode GE, a source electrode SE, and a drain electrode DE. The storage capacitor Cst may include a lower electrode CE1 and an upper electrode CE2.

The semiconductor layer Act may be arranged on the buffer layer 212. The semiconductor layer Act may include polycrystalline silicon. In another example, the semiconductor layer Act may include amorphous silicon, an oxide semiconductor, or an organic semiconductor. In an embodiment, the semiconductor layer Act may include a channel region, a drain region, and a source region, the drain region and the source region being on opposite sides of the channel region.

The first gate insulating layer 213 may be disposed on the semiconductor layer Act and the buffer layer 212. The first gate insulating layer 213 may include an inorganic insulating material such as silicon oxide ($SiO_2$), silicon nitride ($SiN_x$), silicon oxynitride (SiON), aluminum oxide ($Al_2O_3$), titanium oxide ($TiO_2$), tantalum oxide ($Ta_2O_5$), hafnium oxide ($HfO_2$), or zinc oxide ($ZnO_x$). Zinc oxide ($ZnO_x$) may include zinc oxide (ZnO) and/or zinc peroxide ($ZnO_2$).

The gate electrode GE may be disposed on the first gate insulating layer 213. The gate electrode GE may overlap the channel region of the semiconductor layer Act. The gate electrode GE may include a low-resistance metal material. In an embodiment, the gate electrode GE may include a conductive material including molybdenum (Mo), aluminum (Al), copper (Cu), and titanium (Ti) and may include a single layer or a multi-layer including the above materials.

The second gate insulating layer 214 may be disposed on the gate electrode GE and the first gate insulating layer 213. The second gate insulating layer 214 may include an inorganic insulating material such as silicon oxide ($SiO_2$), silicon nitride ($SiN_x$), silicon oxynitride (SiON), aluminum oxide ($Al_2O_3$), titanium oxide ($TiO_2$), tantalum oxide ($Ta_2O_5$), hafnium oxide ($HfO_2$), or zinc oxide ($ZnO_x$).

The upper electrode CE2 may be disposed on the second gate insulating layer 214. The upper electrode CE2 may overlap the gate electrode GE. For example, the gate electrode GE may function as the lower electrode CE1 of the storage capacitor Cst. Though it is shown in FIG. 1D that the storage capacitor Cst overlaps the thin-film transistor TFT, the storage capacitor Cst may not overlap the thin-film transistor TFT in another example. For example, the lower electrode CE1 may be an electrode separate from the gate electrode GE. The upper electrode CE2 may include aluminum (Al), platinum (Pt), palladium (Pd), silver (Ag), magnesium (Mg), gold (Au), nickel (Ni), neodymium (Nd), iridium (Jr), chrome (Cr), calcium (Ca), molybdenum (Mo), titanium (Ti), tungsten (W), and/or copper (Cu), and may include a single layer or a multi-layer including the above materials.

The interlayer insulating layer 215 may be disposed on the upper electrode CE2 and the second gate insulating layer 214. The interlayer insulating layer 215 may include an inorganic insulating material such as silicon oxide ($SiO_2$), silicon nitride ($SiN_x$), silicon oxynitride (SiON), aluminum oxide ($Al_2O_3$), titanium oxide ($TiO_2$), tantalum oxide ($Ta_2O_5$), hafnium oxide ($HfO_2$), or zinc oxide ($ZnO_x$).

The source electrode SE and the drain electrode DE may be disposed on the interlayer insulating layer 215. The source electrode SE and the drain electrode DE may each be connected to the semiconductor layer Act through a contact hole formed in the first gate insulating layer 213, the second gate insulating layer 214, and the interlayer insulating layer 215. At least one of the source electrode SE and the drain electrode DE may include a conductive material including molybdenum (Mo), aluminum (Al), copper (Cu), and titanium (Ti) and may include a single layer or a multi-layer including the above materials. In an embodiment, at least one of the source electrode SE and the drain electrode DE may have a multi-layered structure of Ti/Al/Ti.

The organic insulating layer 216 may be disposed on the source electrode SE, the drain electrode DE, and the interlayer insulating layer 215. The organic insulating layer 216 may include an organic material. The organic insulating layer 216 may include an organic insulating material including a general-purpose polymer such as polymethylmethacrylate (PMMA) or polystyrene (PS), polymer derivatives having a phenol-based group, an acryl-based polymer, an imide-based polymer, an aryl ether-based polymer, an amide-based polymer, a fluorine-based polymer, a p-xylene-based polymer, a vinyl alcohol-based polymer, and a blend thereof.

The light-emitting element may be disposed on the organic insulating layer 216. In an embodiment, the light-emitting element may be an organic light-emitting diode OLED. The organic light-emitting diode OLED may include a pixel electrode 221, an intermediate layer 222, and an opposite electrode 223. The pixel electrode 221 may include a conductive oxide such as indium tin oxide (ITO), indium zinc oxide (IZO), zinc oxide (ZnO), indium oxide ($In_2O_3$), indium gallium oxide (IGO), or aluminum zinc oxide (AZO). In another example, the pixel electrode 221 may include a reflective layer including silver (Ag), magnesium (Mg), aluminum (Al), platinum (Pt), palladium (Pd), gold (Au), nickel (Ni), neodymium (Nd), iridium (Ir), chrome (Cr), or a compound thereof. In another example, the pixel electrode 221 may further include a layer on/under the reflective layer, the layer including ITO, IZO, ZnO, or $In_2O_3$.

The pixel-defining layer 224 may cover the edges of the pixel electrode 221. The pixel-defining layer 224 may include a pixel opening 2240P, and the pixel opening 2240P may overlap the pixel electrode 221. The pixel opening 2240P may define an emission area of light emitted from the organic light-emitting diode OLED. The pixel-defining layer 224 may include an organic insulating material and/or an inorganic insulating material. In an embodiment, the pixel-defining layer 224 may include a light-blocking material.

The spacer 225 may be disposed on the pixel-defining layer 224. The spacer 225 may prevent destruction of the multi-layer on the first substrate 110 in a method of manufacturing a display panel. In the method of manufacturing the display panel, a mask sheet may be used. For example, the mask sheet may enter the inside of the pixel opening 2240P of the pixel-defining layer 224, or be closely attached to the pixel-defining layer 224. The spacer 225 may prevent or reduce defects that a portion of the multi-layer is damaged or destroyed by the mask sheet in case that a deposition material is deposited on the first substrate 110.

The spacer 225 may include an organic material such as polyimide. In another example, the spacer 225 may include an inorganic insulating material such as silicon nitride ($SiN_x$) or silicon oxide ($SiO_2$), or include an organic insulating material and an inorganic insulating material. In an embodiment, the spacer 225 may include a different material from a material of the pixel-defining layer 224. In another example, the spacer 225 and the pixel-defining layer 224 may include the same material. For example, the pixel-defining layer 224 and the spacer 235 may be formed together during a mask process that uses a half-tone mask and the like.

The intermediate layer 222 may be disposed on the pixel electrode 221 and the pixel-defining layer 224. The intermediate layer 222 may include an emission layer 222*b*. The emission layer 222*b* may overlap the pixel electrode 221. The emission layer 222*b* may include a polymer organic material or a low-molecular weight organic material emitting light having a certain color.

The intermediate layer 222 may further include at least one of a first functional layer 222*a* and a second functional layer 222*c*. The first functional layer 222*a* may be disposed between the pixel electrode 221 and the emission layer 222*b*. The first functional layer 222*a* may include a hole transport layer (HTL) and/or a hole injection layer (HIL). The second functional layer 222*c* may be disposed between the emission layer 222*b* and the opposite electrode 223. The second functional layer 222*c* may include an electron transport layer (ETL) and/or an electron injection layer (EIL).

The opposite electrode 223 may be disposed over the pixel electrode 221, the intermediate layer 222, and the pixel-defining layer 224. The opposite electrode 223 may include a conductive material having a low work function. As an example, the opposite electrode 223 may include a transparent layer (or semi-transparent layer) including silver (Ag), magnesium (Mg), aluminum (Al), platinum (Pt), palladium (Pd), gold (Au), nickel (Ni), neodymium (Nd), iridium (Ir), chrome (Cr), or an alloy thereof. In another example, the opposite electrode 223 may further include a layer on the transparent layer (or semi-transparent layer), the layer including ITO, IZO, ZnO, or $In_2O_3$.

The encapsulation layer 300 may be disposed on the display member 200. The encapsulation layer 300 may cover the organic light-emitting diode OLED. In an embodiment, the encapsulation layer 300 may include at least one inorganic encapsulation layer and at least one organic encapsulation layer. It is shown in FIG. 1D that the encapsulation layer 300 includes a first inorganic encapsulation layer 310, an organic encapsulation layer 320, and a second inorganic encapsulation layer 330 that are sequentially stacked.

Referring to FIG. 1E, a first-third portion 113 may be further included compared to the embodiment described with reference to FIG. 1D. Contents that are substantially same as the contents described with reference to FIG. 1D are omitted, for convenience of description.

The first-third portion 113 may be arranged between the first-first portion 111 and the first-second portion 112. As an example, the first-first portion 111, the first-second portion 112, and the first-third portion 113 may be integral with each other. For example, a surface (e.g., a surface facing a Z axis direction) of the first substrate 110 facing the display member 200 may be flat. Accordingly, the display member 200 may be disposed on the first substrate 110 that is flat even in the bent area BA. Forming (or occurrence) of bending or waviness in the display member 200 may be reduced.

The thickness of the first-third portion may be less than the thicknesses of the first-first portion 111 and the first-second portion 112. For example, a surface (e.g., a surface facing a Z axis direction) opposite the surface of the first substrate 110 facing the display member 200 may include a bent surface. Accordingly, in the bent area BA, the flexibility of the display apparatus 1 may increase.

Referring to FIG. 1F, compared to the embodiment described with reference to FIG. 1D, at least one of the first-first surface 111S of the first-first portion 111 adjacent to the first-second portion 112, and the first-second surface 112S of the first-second portion 112 adjacent to the first-first portion 111 may include a curved surface. For example, a damage to the first substrate 110 due to external impacts may be reduced. Contents that are substantially same as the contents described with reference to FIG. 1D are omitted, for convenience of description.

Referring to a cross-sectional shape shown in FIG. 1F, a distance between the first-first surface 111S and the first-second surface 112S may reduce in a direction facing the display member 200. For example, an area in which the first substrate 110 supports the display member 200 may increase. Accordingly, while forming (or occurrence) of bending or waviness in the display member 200 in the bent area BA is reduced, the flexibility of the display apparatus 1 may be increased.

Referring to FIG. 1G, compared to the embodiment described with reference to FIG. 1D, the display apparatus 1 may further include an organic protective layer OPL arranged between the first substrate 110 and the display member 200 and connected to the first substrate 110. Contents that are substantially same as the contents described with reference to FIG. 1D are omitted, for convenience of description.

The organic protective layer OPL may extend between the first substrate 110 and the display member 200 and may overlap the organic light-emitting diode OLED as a light-emitting element. The organic protective layer OPL may include a polymer resin such as polyethersulfone, polyarylate, polyetherimide, polyethylene naphthalate, polyethylene terephthalate, polyphenylene sulfide, polyimide, polycarbonate, cellulose tri acetate, cellulose acetate propionate, and the like. Accordingly, the organic protective layer OPL may prevent foreign materials from penetrating the display member 200 through between the first-first portion 111 and the first-second portion 112 without reducing the flexibility of the display apparatus 1.

Referring to FIG. 1H, the pixel circuit PC may include first to seventh transistors T1, T2, T3, T4, T5, T6, and T7. A first terminal of each of the first to seventh transistors T1, T2, T3, T4, T5, T6, and T7 may be a source terminal or a drain terminal. A second terminal may be a terminal different from the first terminal depending on a type (e.g., a p-type or an n-type) of the transistors. As an example, in the case where the first terminal is a source terminal, the second terminal may be a drain terminal.

The pixel circuit PC may be connected to a first scan line SLn, a second scan line SLn−1, a third scan line SLn+1, the emission control line EL, the data line DL, the driving voltage line PL, and an initialization voltage line VL. The first scan line SLn may transfer first scan signals Sn. The second scan line SLn−1 may transfer second scan signals Sn−1. The third scan line SLn+1 may transfer third scan signals Sn+1. The emission control line EL may transfer emission control signals En. The data line DL may transfer data signals DATA. The driving voltage line PL may transfer the driving voltage ELVDD. The initialization voltage line VL may transfer an initialization voltage Vint.

The first transistor T1 may include a gate terminal, a first terminal, and a second terminal. The gate terminal of the first transistor T1 may be connected to a second node N2. The first terminal of the first transistor T1 may be connected to a first node N1. The second terminal of the first transistor T1 may be connected to a third node N3. The first transistor T1 may function as a driving transistor, and may receive a data signal DATA and supplies a driving current to a light-emitting element according to a switching operation of the second transistor T2. The light-emitting element may be an organic light-emitting element OLED.

The second transistor T2 (e.g., a switching transistor) may include a gate terminal, a first terminal, and a second terminal. The gate terminal of the second transistor T2 may be connected to the first scan line SLn. The first terminal of the second transistor T2 may be connected to the data line DL. The second terminal of the second transistor T2 may be connected to the first node N1 (or the first terminal of the first transistor T1). The second transistor T2 may be turned on according to a first scan signal Sn transferred through the first scan line SLn and may perform a switching operation of transferring a data signal DATA to the first node N1. The data signal DATA may be transferred through the data line DL.

The third transistor T3 (e.g., a compensation transistor) may include a gate terminal, a first terminal, and a second terminal. The gate terminal of the third transistor T3 may be connected to the first scan line SLn, the first terminal of the third transistor T3 may be connected to the second node N2 (or the gate terminal of the first transistor T1), and the second terminal of the third transistor T3 may be connected to the third node N3 (or the second terminal of the first transistor T1). The third transistor T3 may be turned on according to a first scan signal Sn to diode-connect the first transistor T1. The first scan signal Sn may be transferred through the first scan line SLn. The third transistor T3 may have a structure in which two or more transistors are connected in series.

The fourth transistor T4 (e.g., a first initialization transistor) may include a gate terminal, a first terminal, and a second terminal. The gate terminal of the fourth transistor T4 may be connected to the second scan line SLn−1, the first terminal of the fourth transistor T4 may be connected to the initialization voltage line VL, and the second terminal of the fourth transistor T4 may be connected to the second node N2. The fourth transistor T4 may be turned on according to a second scan signal Sn−1 to initialize the gate voltage of the first transistor T1 by transferring the initialization voltage Vint to the gate terminal of the first transistor T1. The second scan signal Sn−1 may be transferred through the second scan line SLn−1. The fourth transistor T4 may have a structure in which two or more transistors are connected in series.

The fifth transistor T5 (e.g., a first emission control transistor) may include a gate terminal, a first terminal, and a second terminal. The gate terminal of the fifth transistor T5 may be connected to the emission control line EL, the first terminal of the fifth transistor T5 may be connected to the driving voltage line PL, and the second terminal of the fifth transistor T5 may be connected to the first node N1.

The sixth transistor T6 (e.g., a second emission control transistor) may include a gate terminal, a first terminal, and a second terminal. The gate terminal of the sixth transistor T6 may be connected to the emission control line EL, the first terminal of the sixth transistor T6 may be connected to the third node N3, and the second terminal of the sixth transistor T6 may be connected to a pixel electrode of an organic light-emitting element OLED. The fifth transistor T5 and the sixth transistor T6 are simultaneously turned on according to an emission control signal En, and a current flows through the organic light-emitting element OLED. The emission control signal En may be transferred through the emission control line EL.

A seventh transistor T7 (e.g., a second initialization transistor) may include a gate terminal, a first terminal, and a second terminal. The gate terminal of the seventh transistor T7 may be connected to the third scan line SLn+1, the first terminal of the seventh transistor T7 may be connected to the pixel electrode of the organic light-emitting element OLED, and the second terminal of the seventh transistor T7 may be connected to the initialization voltage line VL. The seventh transistor T7 may be turned on according to a third scan signal Sn+1 to initialize the voltage of the pixel electrode of the organic light-emitting element OLED by transferring the initialization voltage Vint to the pixel electrode of the organic light-emitting element OLED. The third scan signal Sn+1 may be transferred through the third scan line SLn+1. The seventh transistor T7 may be omitted.

The storage capacitor Cst may include a first electrode and a second electrode. The first electrode of the storage capacitor Cst may be connected to the second node N2, and the second electrode of the storage capacitor Cst may be connected to the driving voltage line PL.

The organic light-emitting element OLED may include the pixel electrode and an opposite electrode facing the pixel electrode. The opposite electrode may receive the common voltage ELVSS. The organic light-emitting element OLED may display images by receiving the driving current from the first transistor T1 and emitting light of a certain color. The opposite electrode may be provided in common, e.g., as one body over the pixels.

Figure 2A:
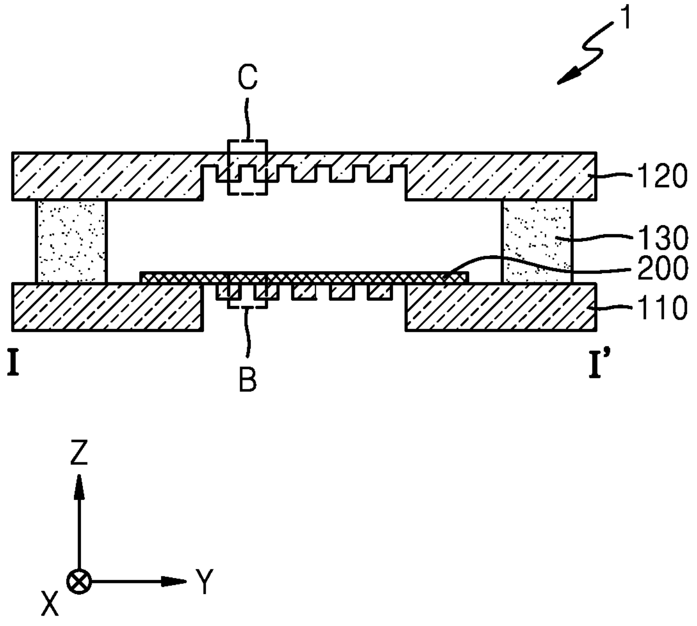
FIG. 2A is a schematic cross-sectional view of the display apparatus, taken along line I-I' of FIG. 1A according to an embodiment.
Figure 2B:
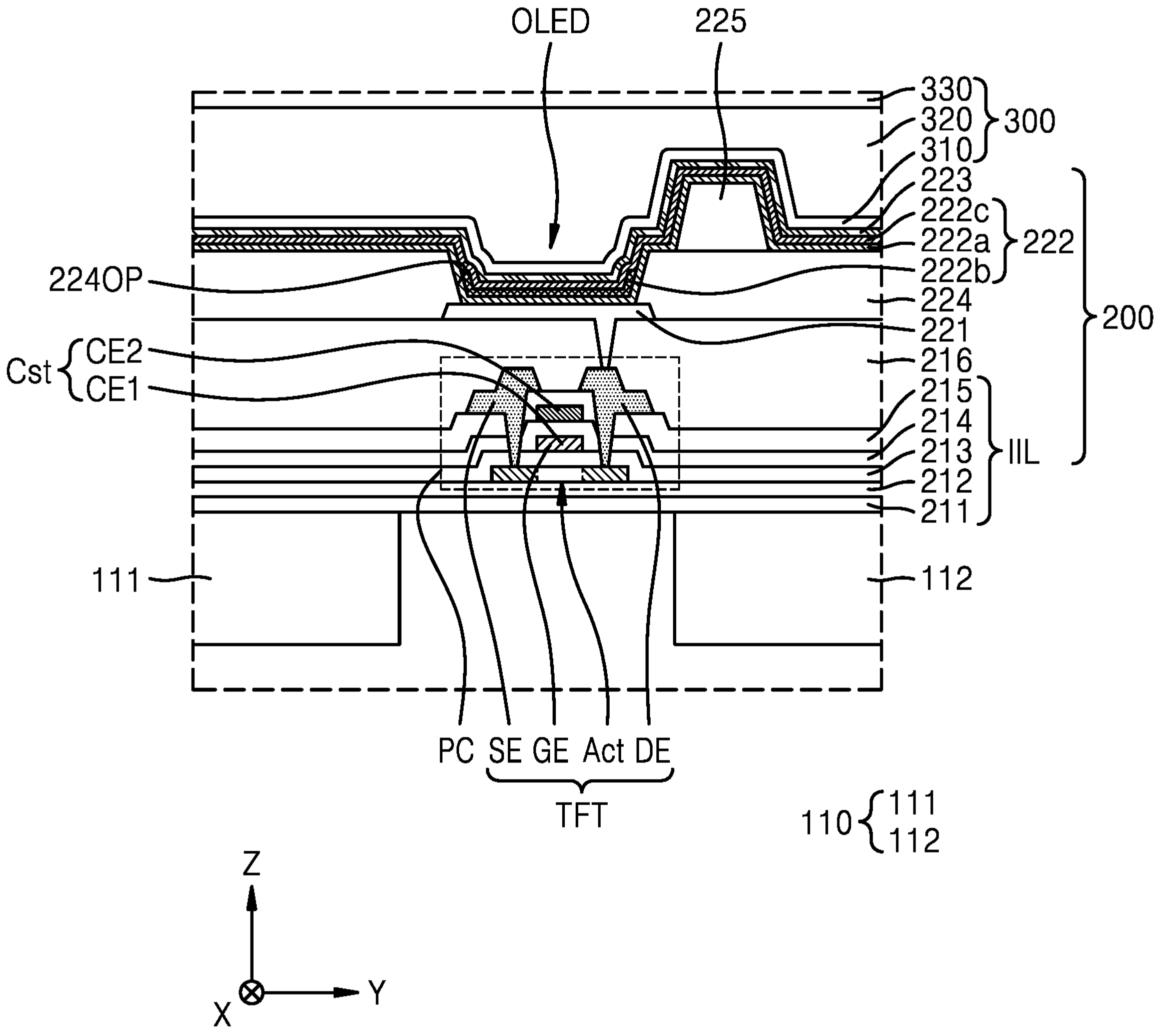
FIG. 2B is a schematic enlarged view of a region B of FIG. 2A according to an embodiment.
Figure 2C:
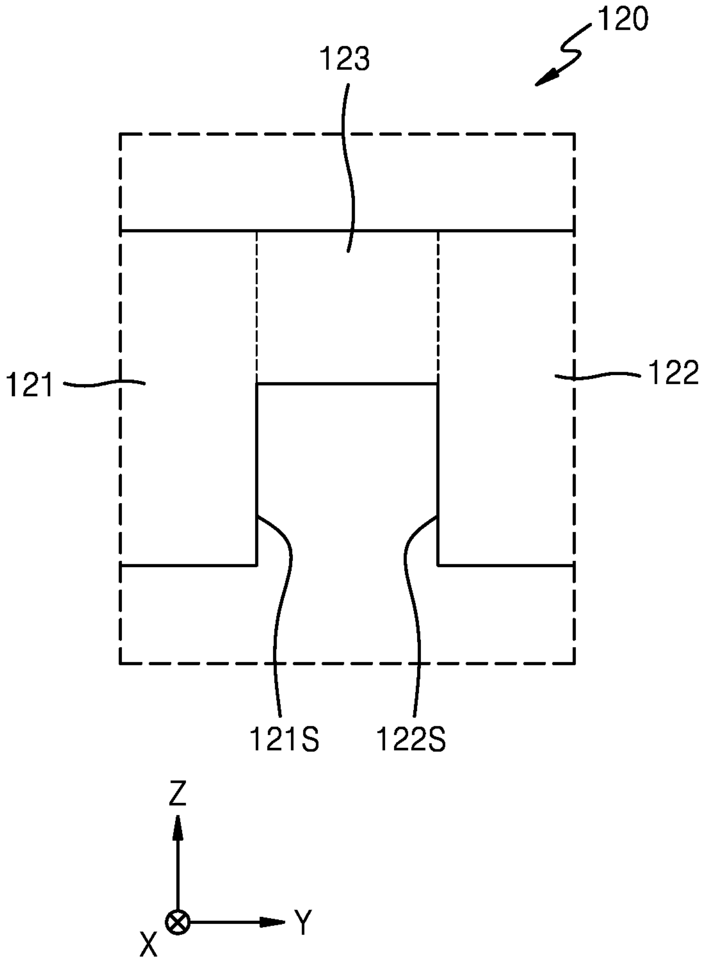
FIG. 2C is a schematic enlarged view of a region C of FIG. 2A according to an embodiment.
Figure 2D:
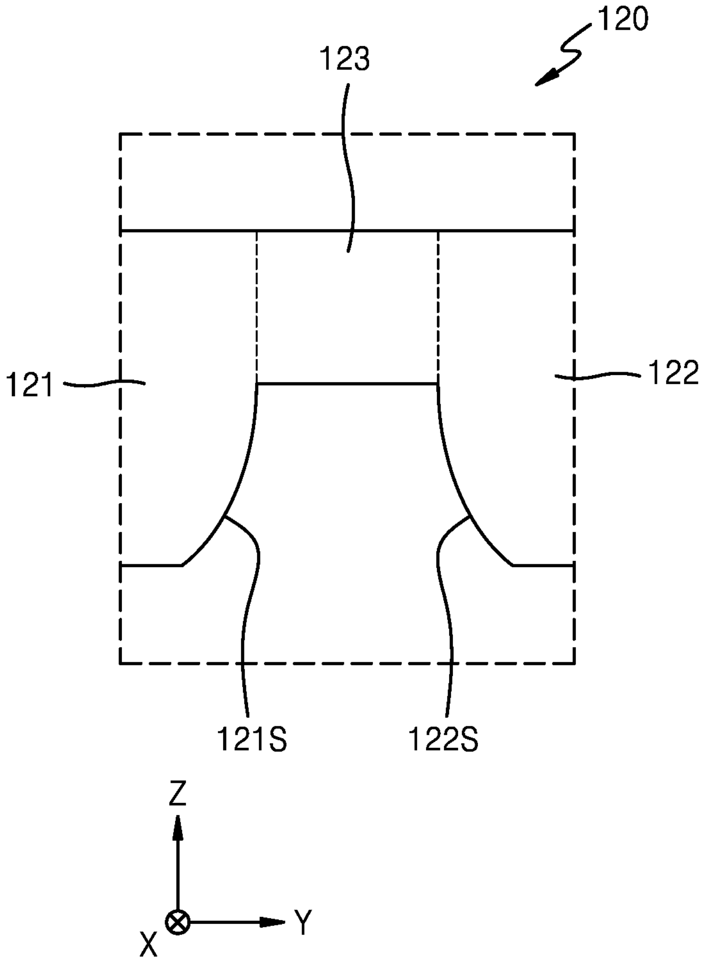
FIG. 2D is a schematic enlarged view of a region C of FIG. 2A according to another embodiment.

FIG. 2A is a schematic cross-sectional view of the display apparatus, taken along line I-I' of FIG. 1A according to an embodiment, FIG. 2B is a schematic enlarged view of a region B of FIG. 2A according to an embodiment, FIG. 2C is a schematic enlarged view of a region C of FIG. 2A according to an embodiment, and FIG. 2D is a schematic enlarged view of a region C of FIG. 2A according to an embodiment.

Referring to FIG. 2A, the display apparatus 1 may include the first substrate 110, the display member 200, a second substrate 120, and a sealing member 130. The display member 200 may be disposed on the first substrate 110, the second substrate 120 may face the first substrate 110, and the sealing member 130 may bond the first substrate 110 to the second substrate 120.

The second substrate 120 may be disposed over the first substrate 110 to which the display member 200 is provided. The second substrate 120 may be disposed over the display member 200 to face the first substrate 110 and may be bonded to the first substrate 110 through the sealing member 130 described below.

The second substrate 120 may be a substrate having a high rigidity. As an example, the second substrate 120 may include a transparent glass material including $SiO_2$ as a main component. However, this is an example, and the second substrate 120 may include at least one of a metal, a plastic, and an acrylic material.

The sealing member 130 may be arranged in the peripheral area PA of the first substrate 110. For example, the first substrate 110 may be bonded to the second substrate 120. The sealing member 130 may be apart by a certain interval from the display member 200 arranged in the display area DA, and also apart in an inner side apart by a certain interval from the outside of the first substrate 110. The sealing member 130 may include, for example, glass frit. As described above, the sealing member 130 may bond the first substrate 110 to the second substrate 120, and the display member 200 may be sealed from the outside.

Referring to FIG. 2B, the first substrate 110 may include the first-first portion 111 and the first-second portion 112. The first-first portion 111 and the first-second portion 112 may be provided in the bent area BA of the display apparatus 1. The first-first portion 111 may be apart from the first-second portion 112. For example, flexibility of the display apparatus 1 may increase in the bent area BA of the display apparatus 1.

As similar to the embodiment of FIG. 1E, the first substrate 110 of FIG. 2B may further include the first-third portion (e.g., the first-third portion 113 in FIG. 1E). As similar to the embodiment of FIG. 1F, at least one of one surface (see the first-first surface 111S in FIG. 1F) of the first-first portion 111 adjacent to the first-second portion 112 and one surface (see the first-second surface 112S in FIG. 1F) of the first-second portion 112 adjacent to the first-first portion 111 may include a curved surface. As similar to the embodiment of FIG. 1G, the first substrate 110 of FIG. 2B may further include the organic protective layer (e.g., the organic protective layer OPL in FIG. 1G). However, regarding the first substrate 110 of FIG. 2B, contents that are substantially same as the contents described with reference to FIGS. 1A to 1H are omitted, for convenience of description.

Referring to FIG. 2C, the second substrate 120 may include glass. The second substrate 120 may be a substrate having a high rigidity. The second substrate 120 may include a second-first portion 121, a second-second portion 122, and a second-third portion 123. The second-first portion 121, the second-second portion 122, and the second-third portion 123 may be provided in the bent area BA of the display apparatus 1.

The second-first portion 121 may be apart from the second-second portion 122. The second-third portion 123 may be arranged between the second-first portion 121 and the second-second portion 122. As an example, the second-first portion 121, the second-second portion 122, and the second-third portion 123 may be integral with each other.

The thickness of the second-third portion 123 may be less than the thicknesses of the second-first portion 121 and the second-second portion 122. For example, a surface (e.g., a surface facing a Z axis direction) of the second substrate 120 facing the display member 200 may include a bent surface. Accordingly, in the bent area BA, the flexibility of the display apparatus 1 may increase.

As an example, the shape of at least one of the second-first portion 121 and the second-second portion 122 may be a linear shape. However, this is only an example, and the shapes of the second-first portion 121 and the second-second portion 122 are not limited thereto.

The second-first portion 121 may include a second-first surface 121S adjacent to the second-second portion 122. For example, the second-second portion 122 may include a second-second surface 122S adjacent to the second-first portion 121. For example, the second-first surface 121S and the second-second surface 122S may be surfaces facing each other. As an example, the second-first surface 121S and the second-second surface 122S may each include a plane. As shown in FIG. 2D, a shape of at least one of the second-first portion 121 and the second-second portion 122 may be quadrangular in terms of a cross-sectional shape. However, this is an example, and the shapes of the second-first portion 121 and the second-second portion 122 are not limited thereto.

Referring to FIG. 2D, compared to the embodiment described with reference to FIG. 2C, at least one of the second-first surface 121S of the second-first portion 121 adjacent to the second-second portion 122, and the second-second surface 122S of the second-second portion 122 adjacent to the second-first portion 121 may include a curved surface. For example, a damage to the first substrate 110 due to external impacts may be reduced. Regarding the embodiment of FIG. 2D, contents that are substantially same as the contents described with reference to FIG. 2C are omitted, for convenience of description.

Figure 3B:
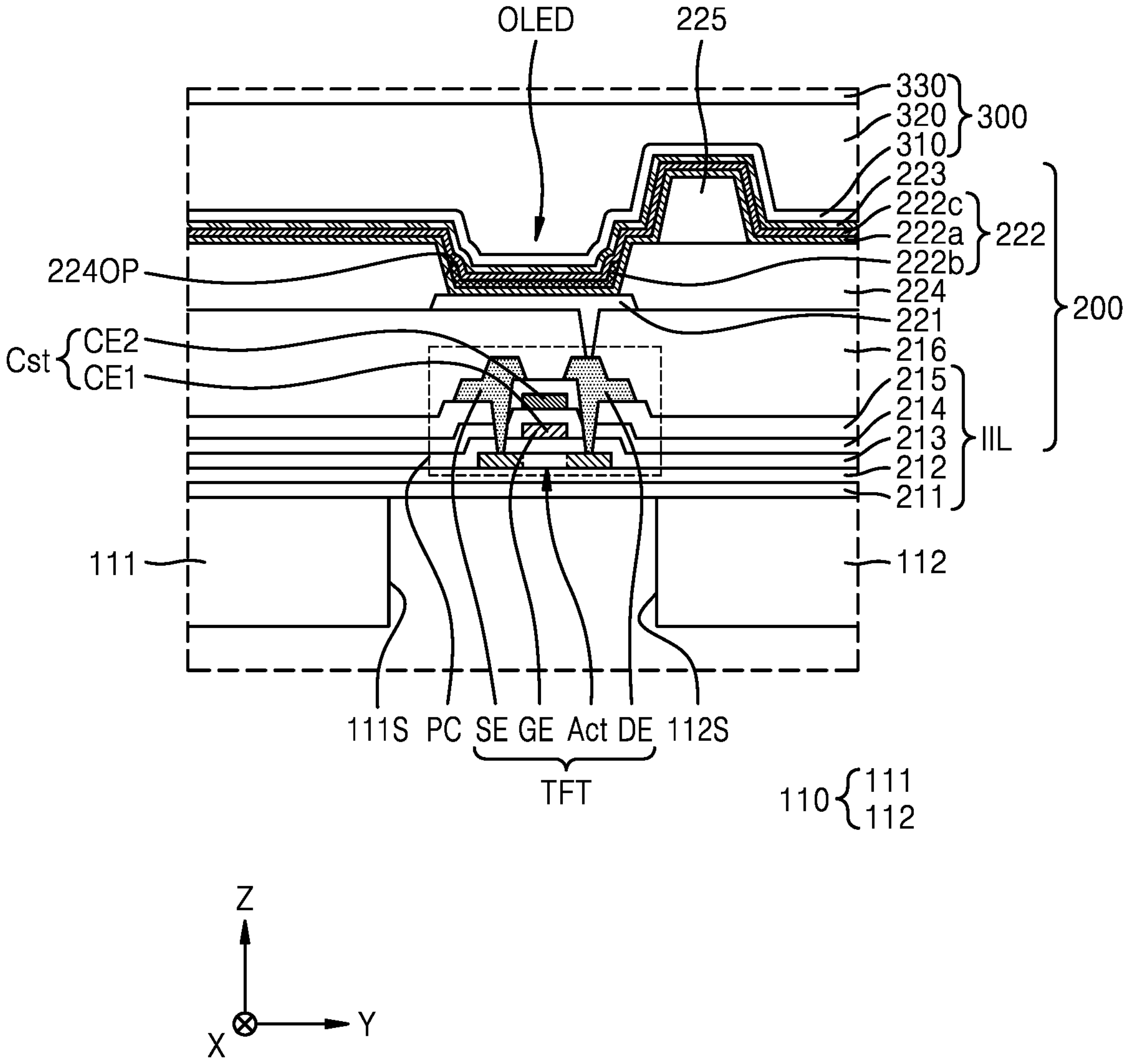
FIG. 3B is a schematic enlarged view of a region D of FIG. 3A according to an embodiment.
Figure 3C:
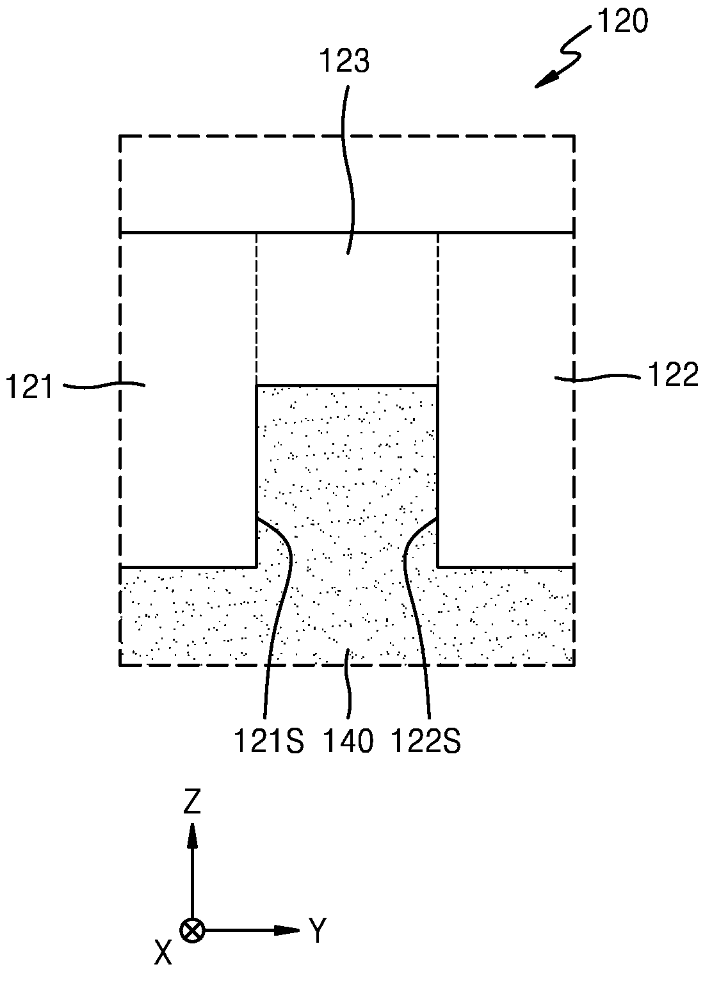

FIG. 3A is a schematic cross-sectional view of the display apparatus, taken along line I-I' of FIG. 1A according to an embodiment, FIG. 3B is a schematic enlarged view of a region D of FIG. 3A according to an embodiment, and FIG. 3C is a schematic enlarged view of a region E of FIG. 3A according to an embodiment.

Referring to FIG. 3A, the display apparatus 1 may include the first substrate 110, the display member 200, the encapsulation layer 300, a resin layer 140, and the second substrate 120.

The display member 200 may be disposed on the first substrate 110, the encapsulation layer 300 may be disposed on the display member 200, and the second substrate 120 may be disposed on the encapsulation layer 300. As the display member 200, the encapsulation layer 300, and the second substrate 120 in FIG. 3A are substantially the same as those described with reference to FIGS. 1A to 2D, detailed descriptions thereof are omitted, for convenience of description.

The resin layer 140 may be disposed between the display member 200 and the second substrate 120. An upper surface (e.g., a surface facing a Z axis direction) of the resin layer 140 may be connected to the second substrate 120, and a lower surface (e.g., a surface facing a Z axis direction) of the resin layer 140 may be connected to at least one of the first substrate 110 and the encapsulation layer 300.

As an example, the resin layer 140 may be an optically clean resin (OCR) layer. The resin layer 140 may be different from a film-type adhesive having a constant thickness. The resin layer 140 may include a light-curable resin, for example, an ultraviolet (UV)-curable resin. The resin layer 140 may include acryl-based resin, for example, an acrylic ester-based material.

Referring to FIG. 3B, the first substrate 110 may include the first-first portion 111 and the first-second portion 112. The first-first portion 111 and the first-second portion 112 may be provided in the bent area BA of the display apparatus 1. The first-first portion 111 may be apart from the first-second portion 112. For example, flexibility of the display apparatus 1 may increase in the bent area BA of the display apparatus 1.

As similar to the embodiment of FIG. 1E, the first substrate 110 of FIG. 3B may further include the first-third portion (e.g., the first-third portion 113 in FIG. 1E). As similar to the embodiment of FIG. 1F, at least one of one surface (see the first-first surface 1115 in FIG. 1F) of the first-first portion 111 adjacent to the first-second portion 112 and one surface (see the first-second surface 112S in FIG. 1F) of the first-second portion 112 adjacent to the first-first portion 111 may include a curved surface. As similar to FIG. 1G, the first substrate 110 of FIG. 3B may further include the organic protective layer (e.g., the organic protective layer OPL in FIG. 1G). However, contents that are substantially same as the contents described with reference to FIGS. 1A to 1H are omitted, for convenience of description.

Referring to FIG. 3C, the second substrate 120 may include a second-first portion 121, a second-second portion 122, and a second-third portion 123. The second-first portion 121, the second-second portion 122, and the second-third portion 123 may be provided in the bent area BA of the display apparatus 1.

The second-first portion 121 may be apart from the second-second portion 122. The second-third portion 123 may be arranged between the second-first portion 121 and the second-second portion 122.

The thickness of the second-third portion 123 may be less than the thicknesses of the second-first portion 121 and the second-second portion 122. For example, a surface (e.g., a surface facing a Z axis) of the second substrate 120 facing the display member 200 may include a bent surface. Accordingly, in the bent area BA, the flexibility of the display apparatus 1 may increase.

At least one of the second-first surface 121S of the second-first portion 121 adjacent to the second-second portion 122 and the second-second surface 122S of the second-second portion 122 adjacent to the second-first portion 121 may include a curved surface. However, contents that are substantially same as the contents described with reference to FIG. 2D are omitted, for convenience of description.

FIGS. 4A to 4C are schematic plan views for explaining a method of manufacturing a display apparatus, according to an embodiment.

First, as shown in FIG. 4A, the display member 200 may be disposed on the first substrate 110, and then, the first substrate 110 may be processed as shown in FIGS. 4B and 4C.

Referring to FIG. 4B, a laser beam may be irradiated to the first substrate 110. As an example, a laser irradiator LS may be disposed over the first substrate 110 and may irradiate a laser beam on the first substrate 110 with moving along a certain path. As the laser beam L is irradiated to the first substrate 110, a gap may be formed in the first substrate 110. Etching solution described below may penetrate the gap formed in the first substrate 110, and at least a portion of the first substrate 110 may be etched. Though it is shown in FIG. 4B that one laser irradiator LS irradiates a laser beam on the first substrate 110 with moving, this is an example, and laser irradiators LS fixed over the first substrate 110 may irradiate a laser beam on the first substrate 110.

Referring to FIG. 4C, a nozzle NS may spray etching solution on the first substrate 110. During this process, at least a portion of the first substrate 110 may be etched, and a thickness of a portion of the first substrate 110 to which the etching solution is sprayed may be reduced. As a gap is formed in a portion of the first substrate 110 to which the laser beam is irradiated, the etching solution may penetrate the first substrate 110 through the gap. Accordingly, more etching may be performed on the portion of the first substrate 110 to which the laser beam is irradiated, and thus, the thickness of the portion of the first substrate 110 to which the laser beam is irradiated may be reduced even more. Accordingly, in case that the etching solution is sprayed to the first substrate 110, a curved surface may be formed in the first substrate 110. For example, the first-first portion 111 and the first-second portion 112 may be disposed on the first substrate 110 by using the laser-irradiated portion where more etching is performed as a boundary.

As described with reference to FIGS. 4B and 4C, a process of manufacturing the second substrate 120 may also include irradiating a laser beam to the second substrate 120, and spraying the etching solution to the second substrate 120. However, as detailed descriptions of these operations are substantially the same as the descriptions made with reference to FIGS. 4B and 4C, the descriptions thereof are omitted, for convenience of description.

FIG. 5A is a schematic plan view of a portion of a display apparatus according to an embodiment, FIG. 5B is a schematic cross-sectional view of the display apparatus, taken along line V-V' of FIG. 5A according to an embodiment, FIG. 6A is a schematic plan view of a portion of a display apparatus according to an embodiment, and FIG. 6B is a schematic cross-sectional view of the display apparatus, taken along line VI-VI' of FIG. 5A according to an embodiment.

Referring to FIGS. 5A and 5B, the first-first portion 111 and the first-second portion 112 may each be provided in plurality. As shown in FIG. 5A, the first-first portions 111 may be apart from each other in a line in a first direction D1. As an example, the first direction D1 may be an X axis direction. For example, the first-second portion 112 may be arranged to be apart in a second direction D2 from the first-first portion 111. The second direction D2 may be a direction intersecting the first direction D1.

As shown in FIG. 5B, the first-second portion 112 may be arranged between the first-first portions 111 adjacent to each other. As an example, as shown in FIG. 5B, when viewed in a Y axis direction, the first-first portion 111 may overlap at least a portion of the first-second portion 112. For example, an overlap area OA in which the first-first portion 111 overlaps the first-second portion may be formed.

However, the description made with reference to FIGS. 5A and 5B is only one example, and the configuration of the first-first portion 111 and the first-second portion 112 is not limited thereto.

As an example, referring to FIGS. 6A and 6B, first-first portions 111 and first-second portions may be arranged in a line in different columns, and each first-first portion 111 and each first-second portion 112 may be arranged on the same column. For example, at least one of the first-first portions 111 and at least one of the first-second portions 112 may be arranged in the same row. Though it is shown in FIG. 6A that the first-first portion 111 and the first-second portion 112 form 4 rows and 5 columns, but this is only an example, and the configuration of the first-first portion 111 and the first-second portion 112 is not limited thereto.

According to embodiments, the flexibility of the display apparatus 1 including the glass substrate may be secured, and the durability of the display apparatus may improve.

Effects of the disclosure are not limited to the above mentioned effects and other effects not mentioned may be clearly understood by those of ordinary skill in the art from the following claims.

In concluding the detailed description, those skilled in the art will appreciate that many variations and modifications may be made to the embodiments without substantially departing from the principles and spirit and scope of the disclosure. Therefore, the disclosed embodiments are used in a generic and descriptive sense only and not for purposes of limitation.

What is claimed is:

1. A display apparatus comprising:
a first substrate;
a display member disposed on the first substrate, the display member comprising a barrier layer and an inorganic buffer layer directly connected to the barrier layer, wherein
the first substrate includes:
a first-first portion overlapping the display member; and
a first-second portion overlapping the display member, the first-second portion being spaced apart from the first-first portion; and
an organic protective layer disposed between the first substrate and the display member, the organic protective layer directly connected to the first substrate and directly connected to the barrier layer.

2. The display apparatus of claim 1, wherein
the first substrate further includes a first-third portion, and
the first-third portion is disposed between the first-first portion and the first-second portion and has a thickness smaller than thicknesses of the first-first portion and the first-second portion.

3. The display apparatus of claim 2, wherein the first-third portion is integral with the first-first portion and the first-second portion.

4. The display apparatus of claim 1, wherein a shape of at least one of the first-first portion and the first-second portion is a linear shape.

5. The display apparatus of claim 1, wherein a cross-sectional shape of at least one of the first-first portion and the first-second portion is quadrangular.

6. The display apparatus of claim 1, wherein at least one of a surface of the first-first portion adjacent to the first-second portion and a surface of the first-second portion adjacent to the first-first portion has a curved surface.

7. The display apparatus of claim 1, wherein the display member includes an inorganic insulating layer connected to the first substrate.

8. The display apparatus of claim 1, further comprising:
an encapsulation layer disposed on the display member.

9. The display apparatus of claim 1, further comprising:
a second substrate disposed over the display member.

10. The display apparatus of claim 9, wherein the second substrate includes:
a second-first portion;
a second-second portion spaced apart from the second-first portion; and
a second-third portion disposed between the second-first portion and the second-second portion and having a thickness less than thicknesses of the second-first portion and the second-second portion.

11. The display apparatus of claim 10, wherein the second-third portion is integral with the second-first portion and the second-second portion.

12. The display apparatus of claim 10, wherein a shape of at least one of the second-first portion and the second-second portion is a linear shape.

13. The display apparatus of claim 10, wherein a cross-sectional shape of at least one of the second-first portion and the second-second portion is quadrangular.

14. The display apparatus of claim 10, wherein at least one of a surface of the second-first portion adjacent to the second-second portion and a surface of the second-second portion adjacent to the second-first portion has a curved surface.

15. The display apparatus of claim 9, further comprising:
a sealing member sealing the first substrate and the second substrate.

16. The display apparatus of claim 9, further comprising:
a resin layer disposed between the display member and the second substrate.

17. The display apparatus of claim 1, wherein
the first-first portion includes a plurality of first-first portions,
the plurality of first-first portions are spaced apart from each other in a line in a first direction, and
the first-second portion is spaced apart from the first-first portion in a second direction and disposed between the first-first portions adjacent to each other.

18. The display apparatus of claim 1, further comprising:
a semiconductor layer on the inorganic buffer layer, the inorganic buffer layer being between the semiconductor layer and the barrier layer.

* * * * *